US012625217B2

(12) United States Patent
Cho

(10) Patent No.: US 12,625,217 B2
(45) Date of Patent: May 12, 2026

(54) METHOD AND APPARATUS FOR DIAGNOSING BATTERY VOLTAGE MEASUREMENT ERROR

(71) Applicant: Samsung SDI Co., Ltd., Yongin-si (KR)

(72) Inventor: Sungchun Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 142 days.

(21) Appl. No.: 18/409,626

(22) Filed: Jan. 10, 2024

(65) Prior Publication Data

US 2025/0085375 A1      Mar. 13, 2025

(30) Foreign Application Priority Data

Sep. 13, 2023    (KR) ........................ 10-2023-0121911

(51) Int. Cl.
*G01R 35/00*          (2006.01)
*G01R 31/3842*        (2019.01)
*G01R 31/396*         (2019.01)

(52) U.S. Cl.
CPC ......... *G01R 35/00* (2013.01); *G01R 31/3842* (2019.01); *G01R 31/396* (2019.01)

(58) Field of Classification Search
CPC .. G01R 35/00; G01R 31/3842; G01R 31/396; G01R 19/10; G01R 31/385; G01R 19/16542; G01R 19/16576; G01R 31/389; Y02E 60/10; H02J 7/007182; H02J 7/0047; H02J 7/0014
See application file for complete search history.

(56) References Cited

U.S. PATENT DOCUMENTS

| | | | |
|---|---|---|---|
| 8,405,352 B2 | 3/2013 | Lim | |
| 10,461,544 B2 | 10/2019 | Yoon et al. | |
| | (Continued) | | |

FOREIGN PATENT DOCUMENTS

| | | | |
|---|---|---|---|
| JP | 2016031793 A | * | 3/2016 |
| KR | 10-1107115 B1 | | 1/2012 |
| | (Continued) | | |

OTHER PUBLICATIONS

EPO Extended European Search Report dated Nov. 27, 2024, issued in corresponding European Patent Application No. 24173877.2, 7 pages.

*Primary Examiner* — Daniel R Miller

(74) *Attorney, Agent, or Firm* — Womble Bond Dickinson (US) LLP

(57) ABSTRACT

A method of diagnosing a voltage measurement error of a battery pack including a plurality of battery cells, the method including: measuring a voltage across opposite ends of each battery cell and performing cell balancing if a voltage difference between the battery cells satisfies a predetermined balancing condition; measuring a cell balancing current flowing through a cell balancing circuit directly connected to opposite ends of a battery cell for which cell balancing is performed; and diagnosing a voltage measurement error based on a difference between a measured cell voltage and a calculated cell voltage of a battery cell, calculated based on a resistance of the cell balancing circuit and the cell balancing current.

11 Claims, 5 Drawing Sheets

(56)  References Cited

U.S. PATENT DOCUMENTS

| | | | |
|---|---|---|---|
| 2010/0060295 A1* | 3/2010 | Ishikawa ............ | G01R 31/3842 |
| | | | 324/601 |
| 2014/0210415 A1* | 7/2014 | Ohmori ................ | H01M 10/44 |
| | | | 320/118 |
| 2014/0266221 A1* | 9/2014 | Baughman ......... | G01R 31/3835 |
| | | | 324/426 |
| 2017/0131378 A1* | 5/2017 | Murata .................... | B60L 1/00 |

FOREIGN PATENT DOCUMENTS

| | | |
|---|---|---|
| KR | 10-2012-0059247 A | 6/2012 |
| KR | 10-1704282 B1 | 2/2017 |
| WO | 2022/145270 A1 | 7/2022 |
| WO | 2022/254978 A1 | 12/2022 |
| WO | 2023/101189 A1 | 6/2023 |

* cited by examiner

METHOD AND APPARATUS FOR DIAGNOSING BATTERY VOLTAGE MEASUREMENT ERROR

CROSS-REFERENCE TO RELATED APPLICATION

The present application claims priority to and the benefit of Korean Patent Application No. 10-2023-0121911, filed on Sep. 13, 2023, in the Korean Intellectual Property Office, the entire disclosure of which is incorporated herein by reference.

BACKGROUND

1. Field

Aspects of one or more embodiments relate to a method and apparatus for diagnosing a battery voltage measurement error.

2. Description of the Related Art

Recently, consumer demand for portable electronic products such as laptops, video cameras, portable phones, etc., have increased rapidly, and as the development of energy storage batteries, robots, satellites, etc., is rapidly advancing, research on high-performance secondary batteries that can be repeatedly charged and discharged has been actively pursued.

In measuring the voltage of secondary batteries, voltage mismeasurement may occur due errors, etc., caused by a voltage sensing circuit unit that measures the voltage of a secondary battery. In this case, a cell balancing operation of balancing cell voltages of a plurality of battery cells may be performed, and in this situation, a problem such as over-charge, over-discharge, etc., may occur due to voltage mismeasurement.

The above information disclosed in this Background section is only for enhancement of understanding of the background and therefore the information discussed in this Background section does not necessarily constitute prior art.

SUMMARY

Aspects of one or more embodiments include a method, a computer program, and an apparatus for diagnosing a battery voltage measurement error, wherein a battery voltage measurement error may be effectively diagnosed in a process of diagnosing the battery voltage measurement error.

However, such characteristics are merely examples, and the scope of embodiments according to the present disclosure are not limited thereto.

Additional aspects will be set forth in part in the description which follows and, in part, will be apparent from the description, or may be learned by practice of the presented embodiments of the present disclosure.

According to one or more embodiments, a method of diagnosing a voltage measurement error of a battery pack including a plurality of battery cells includes measuring a voltage across opposite ends of each battery cells and performing cell balancing if a voltage difference between the battery cells satisfies a predetermined balancing condition, measuring a cell balancing current flowing through a cell balancing circuit directly connected to opposite ends of a battery cell for which cell balancing is performed, and diagnosing a voltage measurement error based on a measured cell voltage and a difference between a calculated cell voltage of a battery cell, calculated based on a resistance of the cell balancing circuit and the cell balancing current.

According to some embodiments, the performing of the cell balancing may include measuring the voltage across the opposite ends of each battery cell, determining a battery cell having a measured voltage greater than other battery cells as a cell balancing target, if the voltage difference between the battery cells is greater than or equal to a predetermined threshold value, and closing a switch provided in a cell balancing circuit directly connected to the opposite ends of the battery cell that is determined as the cell balancing target and includes a resistor and the switch to perform cell balancing.

According to some embodiments, the measuring of the cell balancing circuit may include measuring a cell balancing current flowing through a closed circuit including the battery cell for which cell balancing is performed, the resistor provided in the cell balancing circuit, and the switch provided in the cell balancing circuit.

According to some embodiments, the diagnosing of the voltage measurement error may include obtaining the measured cell voltage by measuring the voltage across the opposite ends of the battery cell for which cell balancing is performed and obtaining the calculated cell voltage of the battery cell for which cell balancing is performed, calculated based on a resistance of the cell balancing circuit and the cell balancing current.

According to some embodiments, the diagnosing of the voltage measurement error may include diagnosing that an error occurs in a voltage measurement unit of the battery pack if the difference between the measured cell voltage and the calculated cell voltage is greater than or equal to a predetermined threshold value.

According to some embodiments, a computer program is stored on a recording medium to execute the above-described method by using a computing device.

According to some embodiments, an apparatus for diagnosing a voltage measurement error of a battery pack including a plurality of battery cells includes a voltage measurement unit electrically connected to opposite ends of each battery cell to measure a voltage of each battery cell, a cell balancing circuit directly connected to the opposite ends of each battery cell and through which a cell balancing current of each battery cell flows, a current measurement unit configured to measure a current flowing through the cell balancing circuit, and a processor configured to perform cell balancing if a voltage difference between the battery cells satisfies a predetermined balancing condition based on the voltage across the opposite ends of each battery cell and diagnose a voltage measurement error based on a difference between a measured cell voltage and a calculated cell voltage of a battery cell, calculated based on a resistance of the cell balancing circuit and the cell balancing current.

According to some embodiments, the processor may be further configured to obtain a voltage across opposite ends of each battery cell, determine a battery cell having a measured voltage greater than other battery cells as a cell balancing target, if the voltage difference between the battery cells is greater than or equal to a predetermined threshold value, and close a switch provided in a cell balancing circuit directly connected to the opposite ends of the battery cell that is determined as the cell balancing target and includes a resistor and the switch to perform cell balancing.

According to some embodiments, the processor may be further configured to obtain, from the current measurement unit, a cell balancing current flowing through a closed circuit including the battery cell for which cell balancing is performed, the resistor provided in the cell balancing circuit, and the switch provided in the cell balancing circuit.

According to some embodiments, the processor may be further configured to obtain the measured cell voltage by measuring the voltage across the opposite ends of the battery cell for which cell balancing is performed, and obtain the calculated cell voltage of the battery cell for which cell balancing is performed, calculated based on a resistance of the cell balancing circuit and the cell balancing current.

According to some embodiments, the processor may be further configured to diagnose that an error occurs in the voltage measurement unit if the difference between the measured cell voltage and the calculated cell voltage is greater than or equal to a predetermined threshold value.

BRIEF DESCRIPTION OF THE DRAWINGS

The above and other aspects, features, and characteristics of certain embodiments of the present disclosure will be more apparent from the following description taken in conjunction with the accompanying drawings, in which.

DETAILED DESCRIPTION

Figure 1:
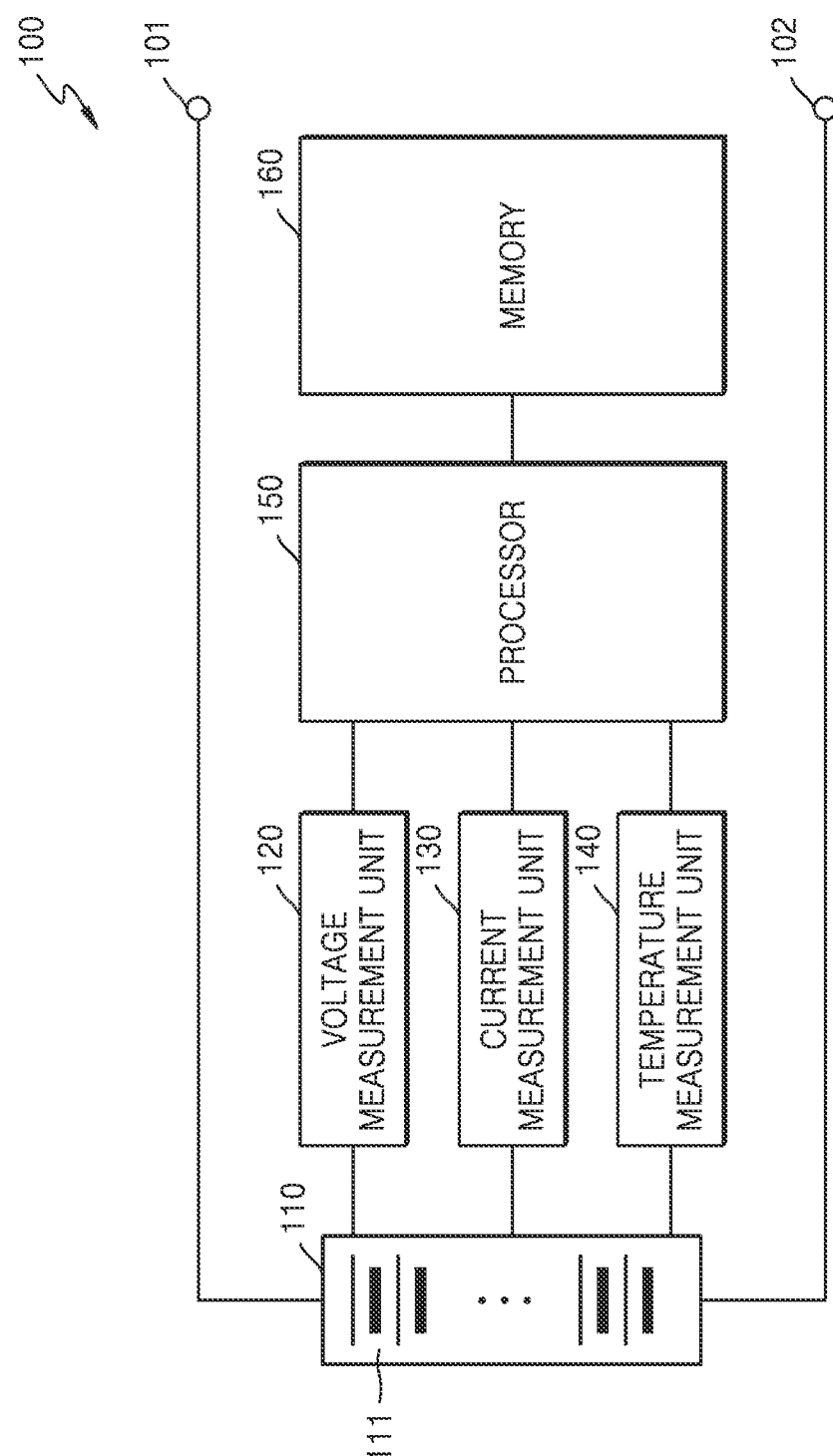
FIG. 1 is a view schematically showing a battery pack according to some embodiments of the present disclosure.

Reference will now be made in more detail to aspects of some embodiments, which are illustrated in the accompanying drawings, wherein like reference numerals refer to like components throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of components, modify the entire list of components and do not modify the individual components of the list.

Hereinafter, various embodiments of the present disclosure will be described in detail with reference to the attached drawings to allow those of ordinary skill in the art to easily carry out the examples of the present disclosure. However, the technical spirit of the present disclosure may not be limited to the embodiments described herein because it may be transformed into various forms and implemented. In the description of the examples disclosed herein, the detailed description of the related known technology will be omitted if it is determined to obscure the subject matter of the technical spirit of the present disclosure. Identical or similar components will be given identical reference numerals and will not be repeatedly described.

Throughout the specification, when a component is "connected" to another component, it may include not only a case where they are "directly connected", but also a case where they are "indirectly connected" with another component therebetween. When an element is referred to as "includes" another component, it may mean that the component may further include still another component rather than excluding the still another component unless stated otherwise.

Some examples may be described with functional block configurations and various processing operations. Some or all of the functional blocks may be implemented with various numbers of hardware and/or software configurations. For example, the functional blocks of the present disclosure may be implemented by one or more microprocessors or circuit configurations for certain functions. The functional blocks of the present disclosure may be implemented with various programming or scripting languages. The functional blocks of the present disclosure may be implemented as an algorithm executed on one or more processors. A function performed by a functional block of the present disclosure may be performed by a plurality of functional blocks, or functions performed by a plurality of functional blocks may be performed by one functional block in the disclosure. Moreover, the disclosure may employ related art for electronic environment setting, signal processing, and/or data processing, etc.

FIG. 1 is a view schematically showing a battery pack according to some embodiments of the present disclosure.

Referring to FIG. 1, a battery pack 100 may include a battery module 110, a processor 150, a memory 160, a voltage measurement unit 120, a current measurement unit 130, and a temperature measurement unit 140.

The battery module 110 may include a plurality of battery cells 111, each of which may be a chargeable secondary battery. For example, each of the battery cells 111 may include at least one selected from a group including a nickel-cadmium battery, a lead acid battery, a nickel metal hydride battery (NiMH), a lithium ion battery, a lithium polymer battery, etc.

A number of battery cells 111 included in the battery module 110 and a connection scheme thereof may be determined based on a power amount, a voltage, etc., required for the battery pack 100. Although it is shown in FIG. 1 for conceptual purposes that the battery cells 111 included in the battery module 110 are connected in series, the battery cells 111 may be connected in parallel, or in series and parallel. Although it is shown in FIG. 1 for conceptual purposes that the battery pack 100 includes one battery module 110, a plurality of battery modules 110 connected in series, in parallel, or in series and parallel may be included. The battery pack 100 may include a pair of pack terminals 101 and 102 to which an electrical load or a charging device may be connected.

As an object for diagnosing a voltage measurement error, a battery may be considered being the battery module 110 or each battery cell 111 included in the battery module 110.

The battery pack 100 according to some embodiments of the present disclosure may include a switch. The switch may be connected between the battery module 110 and one (e.g., the pack terminal 101) of the pack terminals 101 and 102. The switch may be controlled by the processor 150. According to some embodiments, the battery pack 100 may further include a battery protection circuit, a fuse, a current sensor, and so forth.

An apparatus for diagnosing a voltage measurement error according to some embodiments of the present disclosure may include the processor 150 and the memory 160.

The processor 150 may control an overall operation of the apparatus for diagnosing a voltage measurement error. For example, the processor 150 may be implemented in the form selectively including a processor, an application-specific integrated circuit (ASIC), another chipset, a logic circuit, a register, a communication modem, and/or a data processing device, etc., known in art to perform the above-described operation.

The processor 150 may perform basic arithmetic, logic, and input/output operations, and execute program code stored in the memory 160. The processor 150 may store data in the memory 160 or load data stored in the memory 160.

The memory 160 may include a permanent mass storage device, such as random access memory (RAM), read only memory (ROM), and disk drive, as a recording medium readable by the processor 150. The memory 160 may store an operating system and at least one program or application code. The memory 160 may store program code for diagnosing a voltage measurement error according to some embodiments of the present disclosure. The memory 160 may store data generated by measuring at least one parameter of the battery cell 111. For example, the data may include charging/discharging current, terminal voltage and/or temperature of the battery. The memory 160 may store program code for estimating a state of charge (SoC) of the battery using the data, generated by measuring the at least one parameter of the battery cell 111, and SoC-open circuit voltage (OCV) data. The at least one parameter of the battery cell 111 may refer to a component or a variable such as a terminal voltage, a charging/discharging current, and/or an ambient temperature of the battery cell 111.

The voltage measurement unit 120 may be configured to measure a voltage of the battery cell 111. For example, as shown in a configuration of FIG. 1, the voltage measurement unit 120 may be electrically connected to opposite ends of the battery module 110 and/or the battery cell 111. The voltage measurement unit 120 may be electrically connected to the processor 150 to exchange electrical signals. The voltage measurement unit 120 may measure a voltage across the opposite ends of the battery module 110 and/or the battery cell 111 at time intervals and output a signal indicating a magnitude of the measured voltage to the processor 150, under control of the processor 150. The processor 150 may determine the voltage of the battery module 110 and/or the battery cell 111 from the signal output from the voltage measurement unit 120. For example, the voltage measurement unit 120 may be implemented using a voltage measurement circuit generally used in the art.

The current measurement unit 130 may be configured to measure the current of the battery. For example, as shown in the configuration of FIG. 1, the current measurement unit 130 may be electrically connected to a current sensor included in a charging/discharging path of the battery module 110 and/or the battery cell 111. The current measurement unit 130 may be directly connected to opposite ends of each battery cell 111 and thus may be electrically connected to the current sensor provided on a cell balancing circuit of each battery cell 111 in which cell balancing current flows.

The current measurement unit 130 may be electrically connected to the processor 150 to exchange electrical signals. The current measurement unit 130 may repeatedly measure a magnitude of charging current or discharging current of the battery module 110 and/or the battery cell 111 at time intervals and output a signal indicating a magnitude of the measured current to the processor 150, under control of the processor 150. The current measurement unit 130 may output a signal indicating a magnitude of the current flowing through the cell balancing circuit to the processor 150. The processor 150 may determine the magnitude of the current from the signal output from the current measurement unit 130. For example, the current sensor may be implemented using a hall sensor or a sense resistor generally used in the art.

The temperature measurement unit 140 may be configured to measure the temperature of the battery. For example, as shown in the configuration of FIG. 1, the temperature measurement unit 140 may be connected to the battery module 110 and/or the battery cell 111 to measure a temperature of a secondary battery included in the battery module 110 and/or the battery cell 111. The temperature measurement unit 140 may be electrically connected to the processor 150 to exchange electrical signals. The temperature measurement unit 140 may repeatedly measure the temperature of the secondary battery at time intervals and output a signal indicating a magnitude of the measured temperature to the processor 150. The processor 150 may determine the temperature of the secondary battery from the signal output from the temperature measurement unit 140. For example, the temperature measurement unit 140 may be implemented using a thermocouple generally used in the art.

The processor 150 may perform cell balancing if a voltage difference between the battery cells satisfies a balancing condition (e.g., a set or predetermined balancing condition), based on a voltage across both ends of each battery cell 111. The processor 150 may diagnose a voltage measurement error based on a difference between a measured cell voltage and a calculated cell voltage of a battery cell, calculated based on a resistance of the cell balancing circuit and a cell balancing current.

Figure 2:
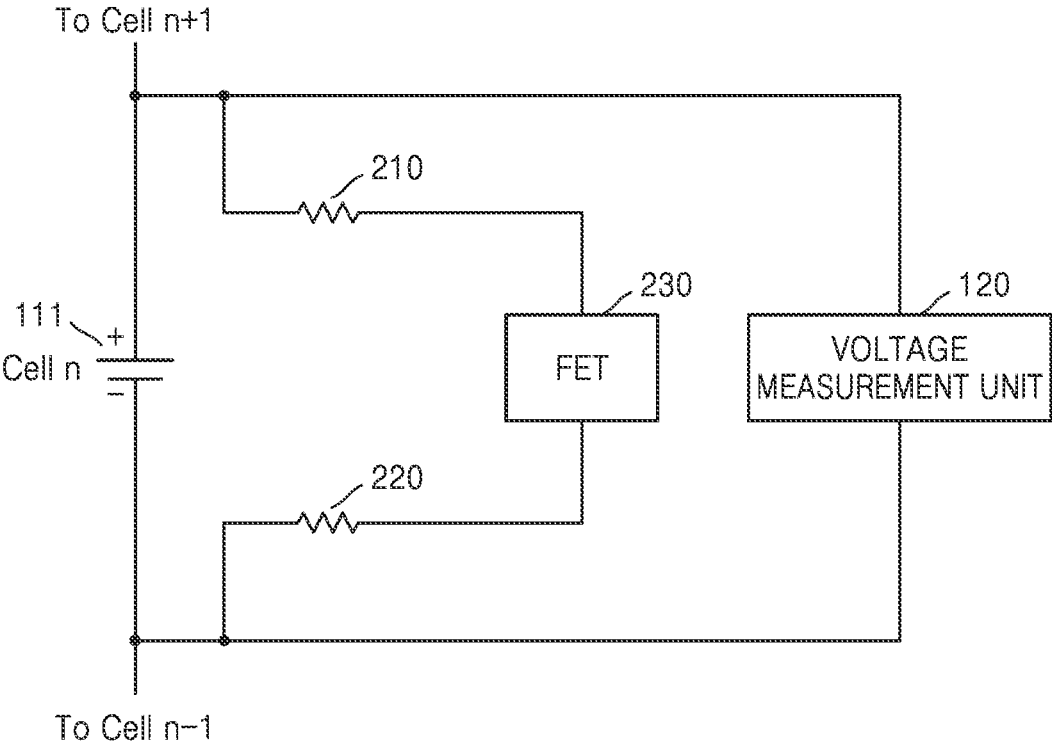
FIG. 2 is a view schematically showing a cell balancing circuit according to some embodiments of the present disclosure.

FIG. 2 is a view schematically showing a cell balancing circuit according to some embodiments of the present disclosure.

Referring to FIG. 2, a cell balancing circuit according to some embodiments of the present disclosure may include the battery cell 111, a first resistor 210, a switch 230, and a second resistor 220. As shown in FIG. 2, the cell balancing circuit may be directly connected to opposite ends of the battery cell 111 to allow cell balancing current of the battery cell 111 to flow therethrough. In this case, the voltage measurement unit 120 may be directly connected to the opposite ends of the battery cell 111 to measure the voltage across the opposite ends of the battery cell 111.

The cell balancing circuit may include a closed circuit including the battery cell 111 for which cell balancing is performed, the resistors 210 and 220 provided in the cell balancing circuit, and the switch 230 provided in the cell balancing circuit.

Figure 3:
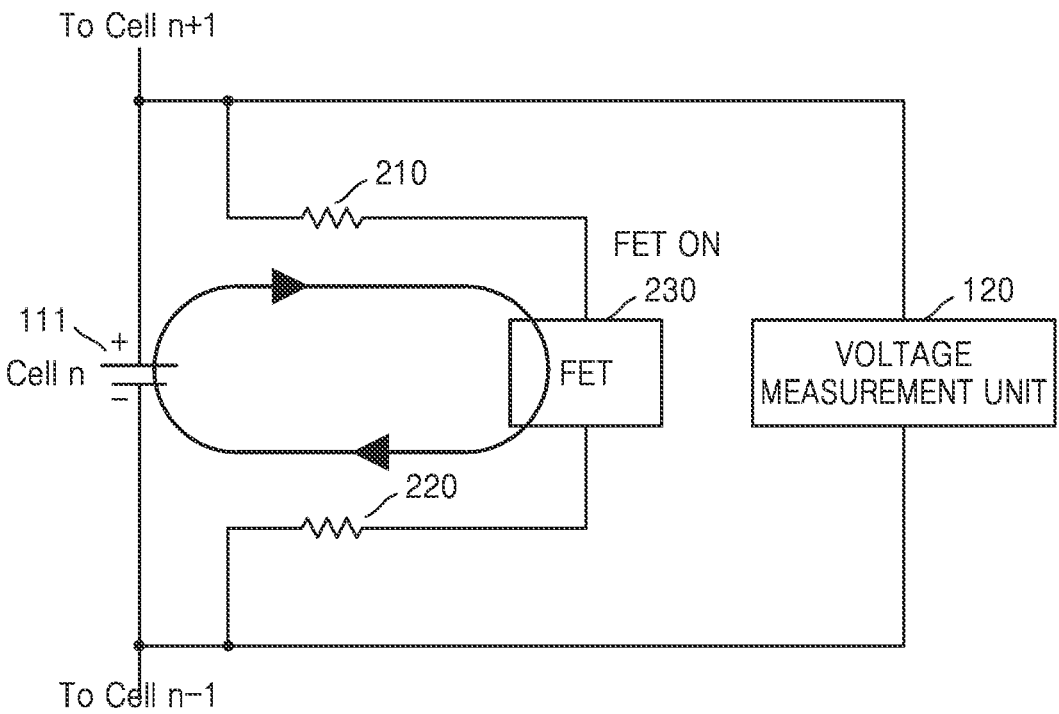
FIG. 3 is a view for describing a method of diagnosing a battery voltage measurement error, according to some embodiments of the present disclosure.
Figure 4:
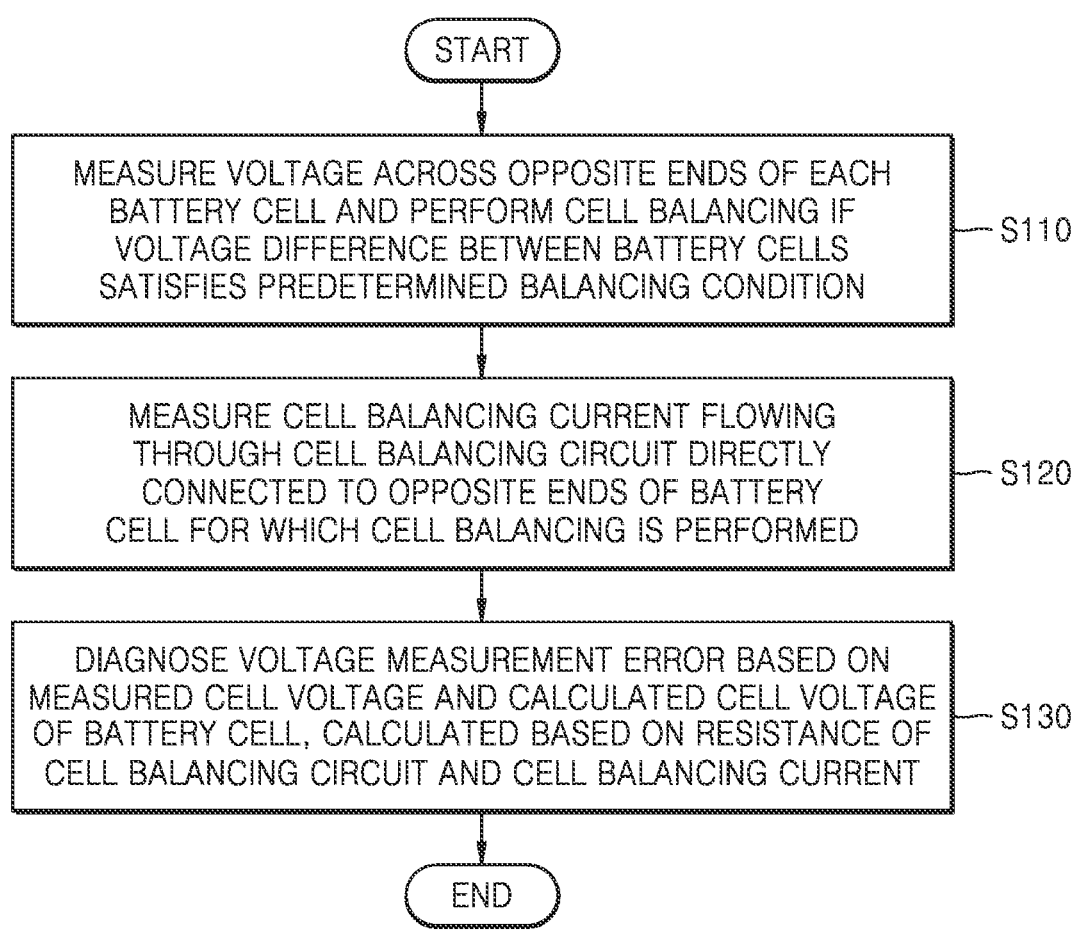
FIG. 4 is a flowchart of a method of diagnosing a battery voltage measurement error, according to some embodiments of the present disclosure.

FIG. 3 is a view for describing a method of diagnosing a voltage measurement error, according to some embodiments of the present disclosure. FIG. 4 is a flowchart of a method of diagnosing a voltage measurement error, according to some embodiments of the present disclosure. A method of diagnosing a voltage measurement error according to some embodiments of the present disclosure may be performed by the processor 150 shown in FIG. 1.

Referring to FIGS. 3 and 4, in operation S110, the processor 150 may measure a voltage across opposite ends of each battery cell and perform cell balancing if a voltage difference between the battery cells satisfies a balancing condition (e.g., a set or predetermined balancing condition).

The processor 150 according to some embodiments of the present disclosure may measure the voltage across the opposite ends of each battery cell 111 by using the voltage measurement unit 120.

The processor 150 may determine the battery cell 111 having a measured voltage greater than other battery cells as a cell balancing target, if the voltage difference between the battery cells is greater than or equal to a threshold value (e.g., a set or predetermined threshold value).

The processor 150 may be directly connected to the opposite ends of the battery cell 111, determined as the cell balancing target, to close the switch 230 provided in the cell balancing circuit including the resistors 210 and 220 and the switch 230 to perform cell balancing.

In operation S120, the processor 150 may measure the cell balancing current flowing through the cell balancing circuit directly connected to the opposite ends of the battery cell 111 in which cell balancing is performed.

The processor 150 according to some embodiments of the present disclosure may measure cell balancing current flowing through the closed circuit including the battery cell 111 in which cell balancing is performed, the resistors 210 and 220 provided in the cell balancing circuit, and the switch 230 provided in the cell balancing circuit.

In operation S130, the processor 150 may diagnose the voltage measurement error based on the difference between the measured cell voltage and the calculated cell voltage of the battery cell, calculated based on the resistors 210 and 220 of the cell balancing circuit and the cell balancing current.

The processor 150 according to some embodiments of the present disclosure may obtain the measured cell voltage obtained by measuring the voltage across the opposite ends of the battery cell 111 in which cell balancing is performed.

The processor 150 may also obtain the calculated cell voltage of the battery cell in which cell balancing is performed, calculated based on the resistors 210 and 220 of the cell balancing circuit and the cell balancing current.

The processor 150 according to some embodiments of the present disclosure may diagnose that an error occurs in the voltage measurement unit of the battery pack if the difference between the measured cell voltage and the calculated cell voltage is greater than or equal to a threshold value (e.g., a set or predetermined threshold value). For example, the processor 150, if diagnosing the voltage measurement error, may generate an alarm or a signal to check a battery management system (BMS) of the battery pack.

For example, referring to FIG. 3, a measured voltage of the battery cell 111 that is a cell balancing target among the plurality of battery cells may be measured as 4.1 V and a measured voltage of the other battery cells may be measured as 4 V. Next, if a voltage difference between the battery cells is greater than or equal to 20 mV as a balancing condition, the battery cell 111 having a voltage measured as 4.1 V may be determined as the cell balancing target according to a condition for performing balancing. Next, the switch 230 (e.g., a field effect transistor (FET)) provided in the cell balancing circuit including the battery cell 111 that is a cell balancing target may be closed (FET on) such that the cell balancing circuit may flow through the cell balancing circuit.

For example, the cell balancing circuit may include two balancing resistors having a resistance of 15Ω and an internal FET resistor having a resistance of 2Ω. In this case, the resistance of the cell balancing circuit may be 32Ω. If the cell balancing current is measured as 125 mA, the calculated cell voltage may be calculated as 4 V based on a formula V=I*R. In this case, the measured cell voltage of the battery cell 111 is 4.1 V and the calculated cell voltage thereof is 4 V, such that a voltage measurement error of 0.1 V occurs.

The processor 150 may diagnose that there is an error in the voltage measurement unit if the difference between the measured cell voltage and the calculated cell voltage is greater than or equal to a threshold value (e.g., a set or predetermined threshold value). For example, if the measured cell voltage is 4.1 V, the calculated cell voltage is 4 V, and the voltage measurement error of 0.1 V occurs, the voltage measurement error is greater than or equal to a threshold value (e.g., a set or predetermined threshold value) (e.g., 20 mV) such that the processor 150 may diagnose that there is an error in the voltage measurement unit and thus generate an alarm. The processor 150 may also prevent the cell balancing operation from being performed by a mismeasured value.

Figure 5:
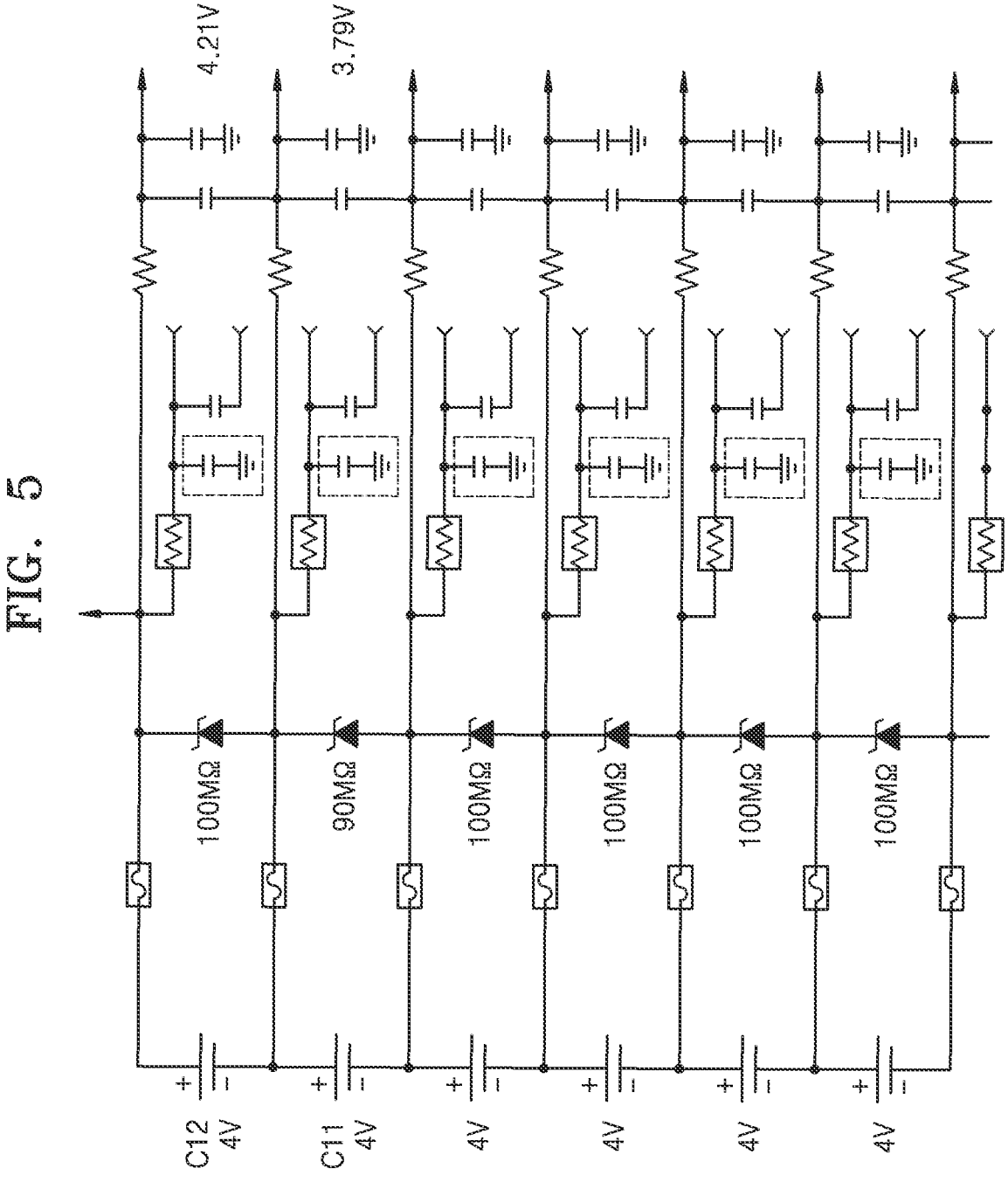
FIG. 5 is a view for describing a method of diagnosing a battery voltage measurement error, according to some embodiments of the present disclosure.

FIG. 5 is a view for describing a method of diagnosing a voltage measurement error, according to some embodiments of the present disclosure.

Referring to FIG. 5, a plurality of battery cells, each having a real voltage of 4 V, and a circuit of a voltage measurement unit connected to opposite ends of each battery cell are schematically shown. However, a resistance and a voltage shown in FIG. 5 are examples, and embodiments according to the present disclosure are not limited thereto.

For example, as shown in FIG. 5, if a normal parallel resistance component of each cell sensing stage is 100 MΩ, a parallel resistance component may be 90 MΩ due to an MLCC fine crack or a feature change of a Zener diode in an 11th battery cell C11, lowering a resistance. In this case, the measured voltage may be different from the real voltage as below due to voltage distribution circuit characteristics.

The measured voltage of a 12th battery cell C12 is 8 V*100/(100+90)=4.21 V, resulting in a difference of 4 V than the real voltage of 4 V. The measured voltage of the 11th battery cell C11 is 8 V*90/(100+90)=3.79 V, resulting in a difference of 4 V than the real voltage of 4 V. In this case, all cells other than the 11th battery cell C11 having the measured voltage of 3.79 V may perform a balancing operation, and the 12th battery cell C12 may continuously perform the balancing operation to the end, thus having the lowest real voltage among modules.

According to the disclosure, by predicting a failure of a BMS using a difference between the sensed voltage and the real cell voltage calculated after the real cell balancing operation, the cell balancing operation caused by the mismeasured value may be prevented, and inspection may be performed in a scheduled A/S dispatch and thus efficient operation may be possible in terms of cost.

The various embodiments described above are illustrative and are not to be independently implemented separately from each other. Embodiments described herein may be implemented in combination with each other.

Various embodiments of the present disclosure may be implemented in the form of a computer program executable on a computer through various components, and the computer program may be recorded on a computer-readable medium. The medium may continuously store an executable program or temporarily store the same for execution or downloading. The medium may include various recording means or storage means in a form of single hardware or a combination of several hardware, and may be distributed over a network without being limited to a medium directly connected to a certain computer system. Examples of the medium may include a magnetic medium such as a hard disk, a floppy disk, and a magnetic tape, an optical recording medium such as a CD-ROM and a DVD, a magneto-optical medium such as a floptical disk, ROM, RAM, flash memory, etc., to store a program instruction. Other examples of the medium may include a recording medium or a storage medium managed by an app store that distributes applications, a site that supplies or distributes various software, a server, etc.

In the specification, the term "unit", "module", etc., may be a hardware component like a processor or a circuit, and/or a software component executed by a hardware component like a processor. For example, "unit", "module", etc., may be implemented by components such as software components, object-oriented software components, class components, and task components, processes, functions, properties, procedures, subroutines, segments of program code, drivers, firmware, microcode, circuits, data, a database, data structures, tables, arrays, and variables.

Those of ordinary skill in the art to which the disclosure pertains will appreciate that the disclosure may be implemented in different detailed ways without departing from the technical spirit or scope of embodiments according to the present disclosure. Accordingly, the aforementioned embodiments of the present disclosure should be construed as being only illustrative, but should not be constructed as being restrictive from all aspects. For example, each element described as a single type may be implemented in a distributed manner, and likewise, elements described as being distributed may be implemented as a coupled type.

The scope of embodiments according to the present disclosure is defined by the following claims, and their equivalents rather than the detailed description, and the meanings and scope of the claims and all changes or modified forms derived from their equivalents should be construed as falling within the scope of embodiments according to the present disclosure.

According to some embodiments of the present disclosure, a method, a computer program, and an apparatus for diagnosing a voltage measurement error of a battery may be provided in which the voltage measurement error of the battery may be effectively diagnosed in a process of diagnosing the voltage measurement error of the battery. However, the scope of embodiments according to the present disclosure is not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of embodiments according to the present disclosure as defined by the following claims, and their equivalents.

What is claimed is:

1. A method of diagnosing a voltage measurement error of a battery pack including a plurality of battery cells, the method comprising:

measuring a voltage across opposite ends of each battery cell and performing cell balancing based on a voltage difference between the battery cells satisfies satisfying a predetermined balancing condition;

measuring a cell balancing current flowing through a cell balancing circuit directly connected to opposite ends of a battery cell for which cell balancing is performed; and diagnosing a voltage measurement error based on a difference between a measured cell voltage and a calculated cell voltage of a battery cell, calculated based on a resistance of the cell balancing circuit and the cell balancing current, wherein the performing of the cell balancing further includes:

measuring the voltage across the opposite ends of each battery cell; and determining a battery cell having a measured voltage greater than other battery cells as a cell balancing target, based on the voltage difference between the battery cells being greater than or equal to a predetermined threshold value.

2. The method as claimed in claim 1, wherein the performing of the cell balancing further comprises:

closing a switch provided in a cell balancing circuit directly connected to the opposite ends of the battery cell that is determined as the cell balancing target and comprises a resistor and the switch to perform cell balancing.

3. The method as claimed in claim 1, wherein the measuring of the cell balancing circuit comprises measuring a cell balancing current flowing through a closed circuit comprising the battery cell for which cell balancing is performed, a resistor provided in the cell balancing circuit, and a switch provided in the cell balancing circuit.

4. The method as claimed in claim 3, wherein the diagnosing of the voltage measurement error comprises:

obtaining the measured cell voltage by measuring the voltage across the opposite ends of the battery cell for which cell balancing is performed; and obtaining the calculated cell voltage of the battery cell for which cell balancing is performed, calculated based on a resistance of the cell balancing circuit and the cell balancing current.

5. The method as claimed in claim 4, wherein the diagnosing of the voltage measurement error comprises diagnosing that an error occurs in a voltage measurement unit of the battery pack based on the difference between the measured cell voltage and the calculated cell voltage being greater than or equal to a predetermined threshold value.

6. A non-transitory computer-readable medium storing instructions that, when executed by one or more processors, cause the one or more processors to execute the method according to claim 1.

7. An apparatus for diagnosing a voltage measurement error of a battery pack including a plurality of battery cells, the apparatus comprising:

a voltage measurement unit electrically connected to opposite ends of each battery cell and configured to measure a voltage of each battery cell;

a cell balancing circuit directly connected to the opposite ends of each battery cell and configured to have a cell balancing current of each battery cell flow therethrough;

a current measurement unit configured to measure a current flowing through the cell balancing circuit; and a processor configured to perform cell balancing based on a voltage difference between the battery cells satisfying a predetermined balancing condition based on the voltage across the opposite ends of each battery cell and to diagnose a voltage measurement error based on a difference between a measured cell voltage and a calculated cell voltage of a battery cell, calculated based on a resistance of the cell balancing circuit and the cell balancing current, wherein the processor is further configured to obtain a voltage across opposite ends of each battery cell, to determine a battery cell having a measured voltage greater than other battery cells as a cell balancing target, based on the voltage difference between the battery cells being greater than or equal to a predetermined threshold value.

8. The apparatus as claimed in claim 7, wherein the processor is further configured to close a switch provided in a cell balancing circuit directly connected to the opposite ends of the battery cell that is determined as the cell balancing target and comprises a resistor and the switch to perform cell balancing.

9. The apparatus as claimed in claim 7, wherein the processor is further configured to obtain, from the current measurement unit, a cell balancing current flowing through a closed circuit comprising the battery cell for which cell balancing is performed, a resistor provided in the cell balancing circuit, and a switch provided in the cell balancing circuit.

10. The apparatus as claimed in claim 9, wherein the processor is further configured to obtain the measured cell voltage by measuring the voltage across the opposite ends of the battery cell for which cell balancing is performed, and to obtain the calculated cell voltage of the battery cell for which cell balancing is performed, calculated based on a resistance of the cell balancing circuit and the cell balancing current.

11. The apparatus as claimed in claim 10, wherein the processor is further configured to diagnose that an error occurs in the voltage measurement unit based on the difference between the measured cell voltage and the calculated cell voltage being greater than or equal to a predetermined threshold value.

\*  \*  \*  \*  \*